(12) United States Patent
Kauffman

(10) Patent No.: US 10,587,239 B2
(45) Date of Patent: Mar. 10, 2020

(54) ELECTRICAL POWER CONDITIONING DEVICE

(71) Applicant: George M. Kauffman, Hudson, MA (US)

(72) Inventor: George M. Kauffman, Hudson, MA (US)

(*) Notice: Subject to any disclaimer, the term of this patent is extended or adjusted under 35 U.S.C. 154(b) by 35 days.

(21) Appl. No.: 15/813,316

(22) Filed: Nov. 15, 2017

(65) Prior Publication Data
US 2018/0138884 A1    May 17, 2018

Related U.S. Application Data

(60) Provisional application No. 62/422,387, filed on Nov. 15, 2016.

(51) Int. Cl.
| | |
|---|---|
| *H03H 7/01* | (2006.01) |
| *H02H 9/04* | (2006.01) |
| *H05K 1/18* | (2006.01) |
| *H05K 1/02* | (2006.01) |
| *H05K 1/14* | (2006.01) |

(52) U.S. Cl.
CPC ............ *H03H 7/17* (2013.01); *H02H 9/041* (2013.01); *H03H 7/0138* (2013.01); *H05K 1/181* (2013.01); *H05K 1/0257* (2013.01); *H05K 1/144* (2013.01); *H05K 2201/09027* (2013.01); *H05K 2201/1006* (2013.01); *H05K 2201/10015* (2013.01)

(58) Field of Classification Search
CPC ........ H03H 7/17; H03H 7/0138; H05K 1/181; H05K 2201/10015; H05K 2201/1006
See application file for complete search history.

(56) References Cited

U.S. PATENT DOCUMENTS

| | | |
|---|---|---|
| 3,824,431 A | 7/1974 | Schlicke |
| 8,675,339 B2 | 3/2014 | Kauffman |

(Continued)

FOREIGN PATENT DOCUMENTS

JP          06310222 A   *  11/1994

*Primary Examiner* — Robert J Pascal
*Assistant Examiner* — Kimberly E Glenn
(74) *Attorney, Agent, or Firm* — Kriegsman & Kriegsman

(57) ABSTRACT

An electrical power conditioning device for transmitting energy between a source and a load includes an inner conductor that extends within a grounded outer conductor. A low-pass filter extends between the inner and outer conductors and is designed to attenuate high frequency energy transmitted by the inner conductor. The low-pass filter includes at least one capacitor array which comprises multiple capacitor sectors mounted on a common a printed circuit board in a radial arrangement, each sector including a T-shaped configuration of ceramic capacitors to provide operational redundancy. Additionally, a voltage suppressor extends between the inner and outer conductor and suppresses transient voltages transmitted by the inner conductor. The suppressor includes a pair of printed circuit boards between which a plurality of diodes extend in a circular array around the inner conductor, the printed circuit boards electrically connecting the diodes in series to allow for higher overall pulse current capabilities.

11 Claims, 11 Drawing Sheets

(56) References Cited

U.S. PATENT DOCUMENTS

| | | | |
|---|---|---|---|
| 2005/0024813 A1* | 2/2005 | Shimizu | H01G 4/38 |
| | | | 361/328 |
| 2012/0068789 A1* | 3/2012 | Jones | H01T 4/08 |
| | | | 333/185 |
| 2012/0293910 A1 | 11/2012 | Kauffman | |
| 2014/0177122 A1 | 6/2014 | Kauffman | |

* cited by examiner

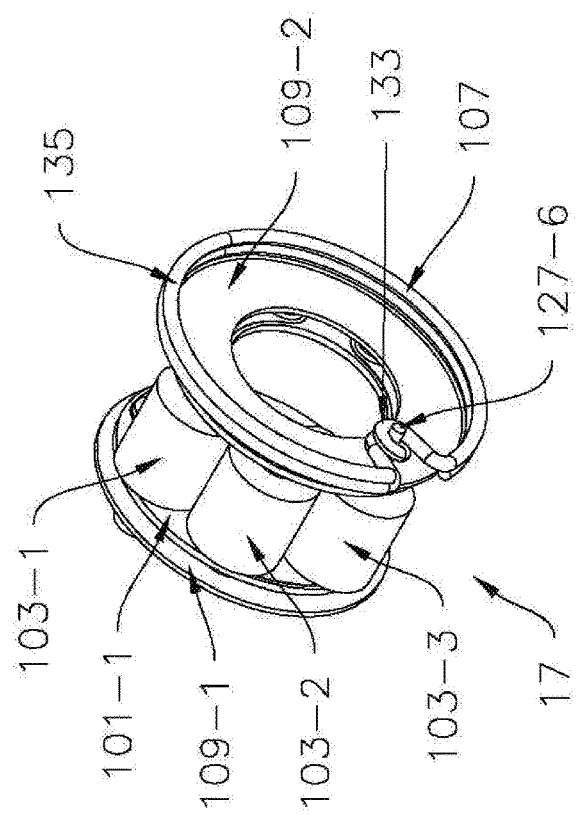
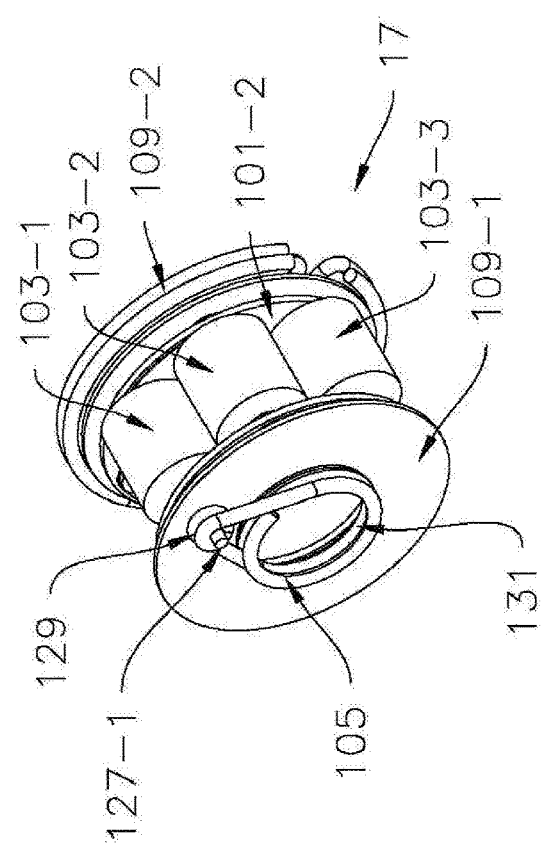

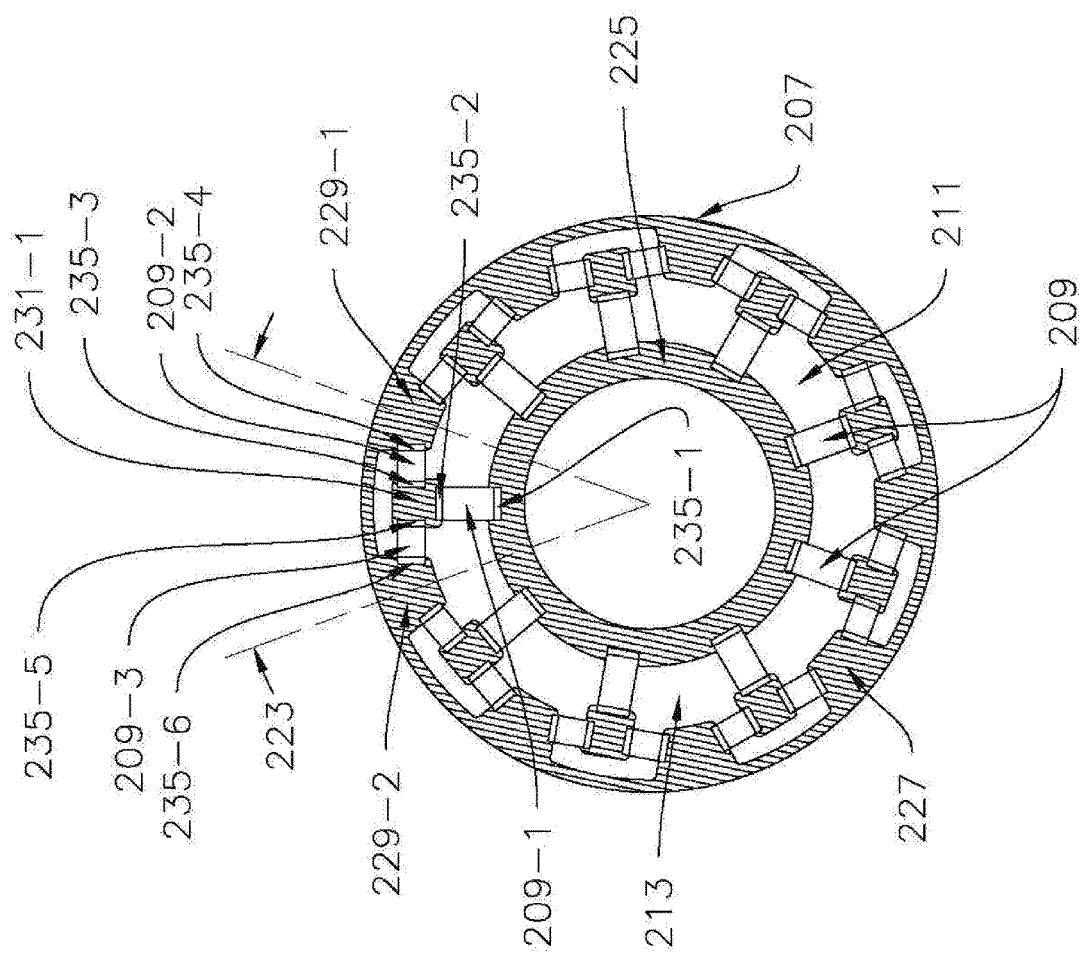
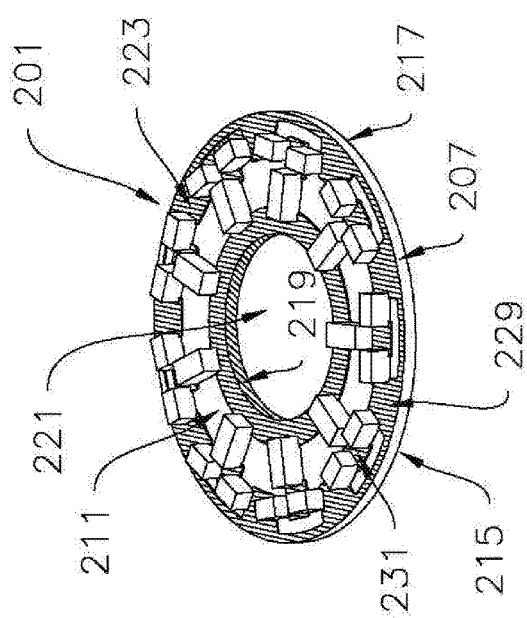
Fig. 10(a)
Fig. 10(b)

ELECTRICAL POWER CONDITIONING DEVICE

FIELD OF THE INVENTION

The present invention relates generally to electrical power systems and, more particularly, to electric devices that are used in electrical power systems to transmit electrical energy from a source to a load.

BACKGROUND OF THE INVENTION

An electrical power system, or line, is a network of electrical components that is configured to deliver electromagnetic energy from at least one source to at least one load. An electric device is commonly used in such systems to transmit electrical power.

An electric device typically comprises an inner signal conductor which serves to transmit the desired electrical power between a source and a load. The inner conductor is separated from an outer conductor by an insulating material, or dielectric material, with the outer conductor being typically grounded. In electrical power conditioning devices, internal components or circuits are often arranged between the inner conductor and the outer conductor to reduce unwanted electrical energy.

High frequency energy, or noise, (e.g. of the type causing electromagnetic interference) is often introduced into the transmission line of electrical power systems. As can be appreciated, the presence of electrical noise can cause system malfunction or interference with sensitive circuits, and, as such, is removed to the greatest extent possible.

A low-pass filter is one type of electrical power conditioning device that is commonly incorporated into electrical power systems to suppress high frequency energy. For ease of installation into electrical power systems, low-pass filters are commonly integrated into coaxial electric devices, with the filter circuit extending between the inner power through conductor and the grounded outer conductor.

In use, a low-pass filter contained within an electric device allows for power with a frequency lower than a designated cutoff level to be transmitted along the inner conductor and, in turn, delivered to the intended load. By contrast, electrical energy present along the inner conductor with a frequency above the defined cutoff is attenuated and thereby substantially eliminated from transmission to the intended load.

Low-pass filters have various constructs but typically include at least one capacitor for removing unwanted high frequency energy. For instance, a shunt capacitor filter is a simple, first-order, low-pass filter that includes a single shunt capacitor for attenuating undesirable alternating current (AC) signals. Higher-order filters with multiple attenuating components, such as a Pi filter, are also commonly utilized in noise suppression applications, but are often difficult to construct in a compact fashion, particularly within a limited-size coaxial device package.

Accordingly, in order to maintain a compact construction, low-pass filters are often designed using the smallest available component parts. Because ceramic capacitors are generally considered the most compact type of capacitor, ceramic capacitors are particularly well suited for use in low-pass filters. Furthermore, in addition to its compact construction, ceramic capacitors have a relatively high temperature range, particularly as compared to plastic film capacitors.

Although beneficial for at least the reasons set forth above, ceramic capacitors are often disfavored for use in low-pass filters due to their inherent fragility. In fact, ceramic capacitors routinely exhibit failure modes over time, such as short circuiting due to cracking or other structural defects. As can be appreciated, the shorting of a ceramic capacitor in a low-pass filter can result in arcing and overheating within the electrical power line, particularly when used to transmit direct current (DC) voltages.

Furthermore, it should be noted that, due to package size restrictions and other related factors, conventional electrical power conditioning devices with noise suppression capabilities are not typically designed to additionally treat transient voltages, particularly if the energy content is below of the filtering band frequency. For example, if a transient voltage has a pulse width longer than the reciprocal of the cutoff frequency of the filter, the transient voltage is substantially unaffected by the filter and, as such, is delivered through the filter. For obvious reasons, random electrical impulses or energy spikes, particularly if the transient energy is of a voltage substantially higher than the operating power voltage level of the power system, can be highly problematic to any sensitive electrical components located along the electrical power line.

Because of these risks, electrical power systems typically rely upon separate devices for filtering noise and suppressing transient voltages. Specifically, low-pass filters are commonly integrated into electrical power systems to remove high frequency electromagnetic energy transmitted along the transmission line. Further, transient voltage suppression devices, or suppressors, are commonly integrated into electrical power systems, at a separate location from the low-pass filters, to discharge any high voltage electromagnetic energy transmitted along the transmission line. Typically, voltage suppressors include one or more voltage suppression components, such as gas discharge tubes and/or diodes, which are conductively coupled to the transmission line, preferably at a location close to a potential impulse source, in order to immediately suppress any transient pulses of electromagnetic energy.

SUMMARY OF THE INVENTION

It is an object of the present invention to provide a new and improved device for transmitting electrical power from a source to a load.

It is another object of the present invention to provide a device as described above which is provided with at least one component for removing any high frequency energy present in the transmission path from the source to the load.

It is yet another object of the present invention to provide a device as described above which is provided with at least one component for suppressing transient, high voltage signals present in the transmission path from the source to the load.

It is still another object of the present invention to provide a device as described above that incorporates all components into a coaxial device construction.

It is yet still another object of the present invention to provide a device as described above that is relatively compact in size, has a limited number of parts, is inexpensive to manufacture, and is easy to use.

Accordingly, as a principal feature of the present invention, there is provided an electrical power conditioning device for transmitting electromagnetic energy between a source and a load, the device comprising (a) an outer conductor, (b) an inner conductor for transmitting the electromagnetic energy between the source and the load, the inner conductor extending within the outer conductor, the inner and outer conductors being spaced apart and electrically insulated from one another, (c) a low-pass filter disposed between the outer conductor and the inner conductor, the low-pass filter attenuating electromagnetic energy transmitted along the inner conductor which has a frequency higher than a designated cutoff level, and (d) a voltage suppressor pack disposed between the outer conductor and the inner conductor, the voltage suppression pack treating transient voltages transmitted along the inner conductor.

Various other features and advantages will appear from the description to follow. In the description, reference is made to the accompanying drawings which form a part thereof, and in which is shown by way of illustration, an embodiment for practicing the invention. The embodiment will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

In the drawings wherein like reference numerals represent like parts:

FIGS. 5(a) and 5(b) are left end perspective and right end perspective views, respectively, of the voltage suppression pack shown in FIG. 4;

FIGS. 10(a) and 10(b) are right end perspective and right end plan views, respectively, of the second capacitor array shown in FIG. 9;

DETAILED DESCRIPTION OF THE INVENTION

Electrical Power Conditioning Device 11

Figure 1:
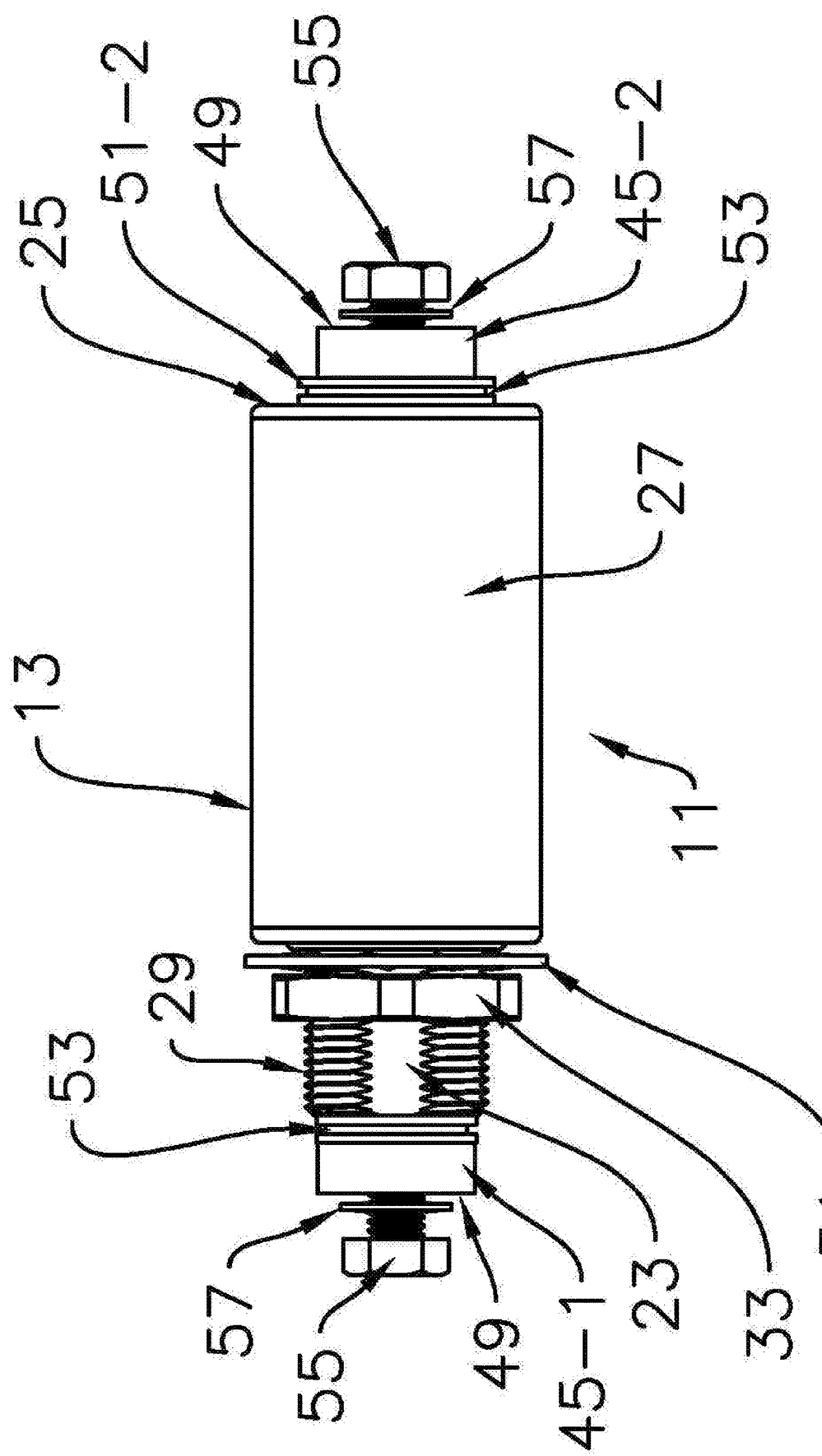
FIG. 1 is a front perspective view of an electrical power conditioning device constructed according to the teachings of the present invention.
Figure 2:
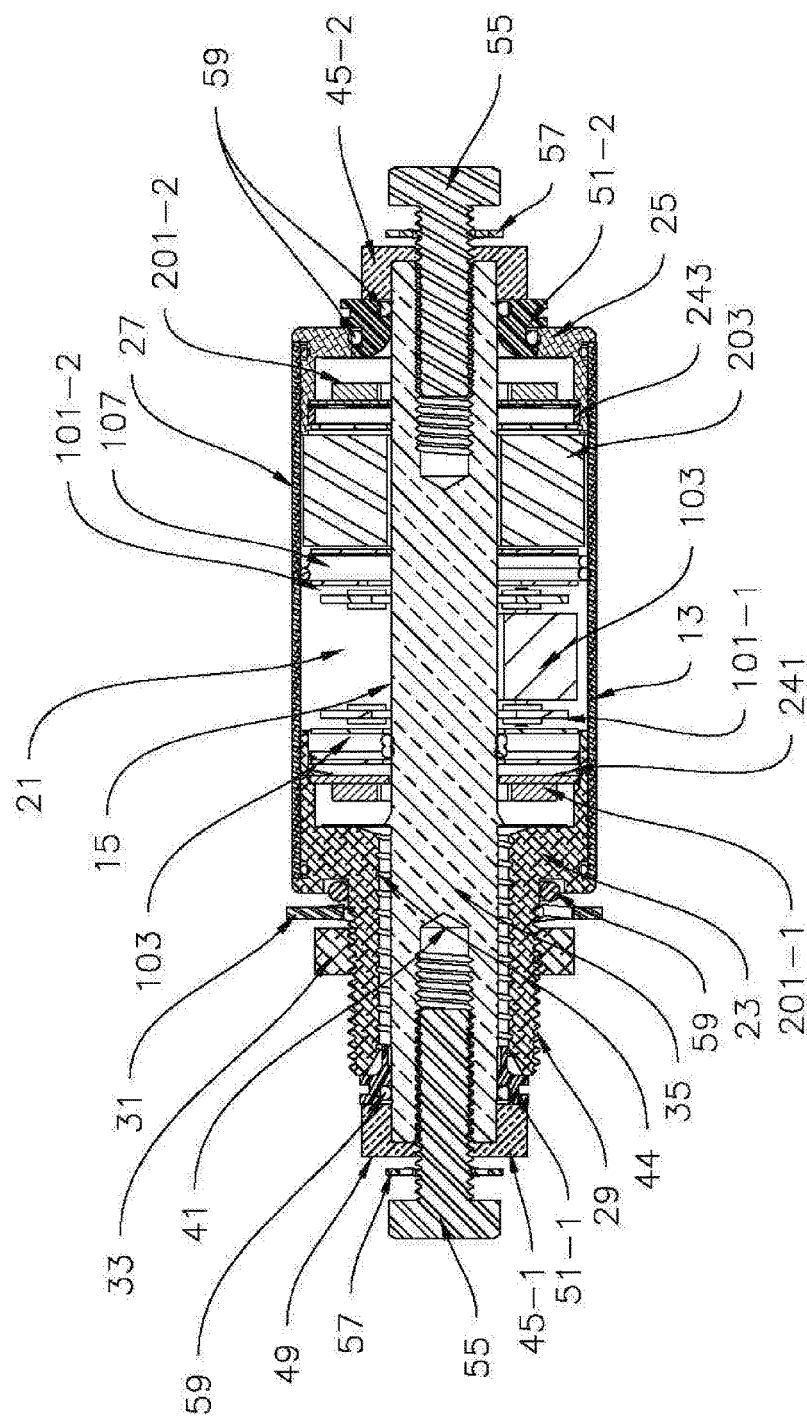
FIG. 2 is a longitudinal section view of the electrical power conditioning device shown in FIG. 1.
Figure 3:
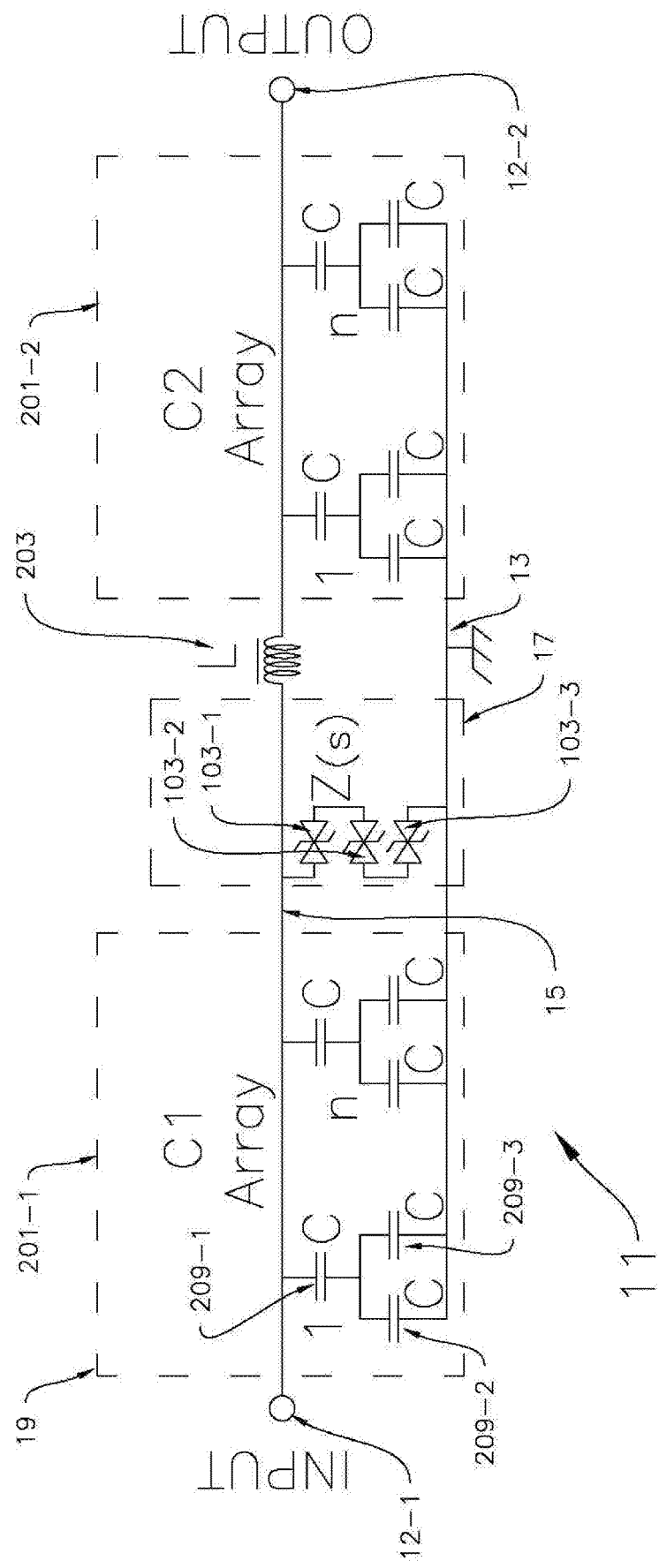
FIG. 3 is a circuit diagram representative of the electrical power conditioning device shown in FIG. 2, the circuit diagram being shown in relation to an input and an output, each capacitor array being shown with an indefinite number of capacitor sectors for ease of illustration.

Referring now to FIGS. 1-3, there is shown an electrical power conditioning device constructed according to the teachings of the present invention, the device being identified generally by reference numeral 11. As will be described in detail below, electrical power conditioning device 11 is specifically designed to suppress both high frequency electromagnetic energy as well as transient voltages that are transmitted within a designated electrical power system.

As seen most clearly in FIG. 3, electrical power conditioning device 11 is designed to transmit electromagnetic signals between a source, or input, 12-1 and a load, or output, 12-2. Device 11 comprises (i) a grounded outer conductor 13, (ii) an inner conductor 15 extending within outer conductor 13 in a spaced apart relationship relative thereto, (iii) a voltage suppression pack, or voltage suppressor, 17 extending between inner conductor 15 and outer conductor 13 for discharging potentially harmful transient voltages transmitted along inner conductor 15, and (iv) a low-pass filter 19 extending between inner conductor 15 and outer conductor 13 for removing high frequency energy transmitted along inner conductor 15. As will be explained in detail below, the integration of both a voltage suppressor 17 and a low-pass filter 19 into a common package, including the unique structural configuration of parts to physically accommodate such components, serves as a principle novel feature of the present invention.

Outer Conductor 13

Outer conductor 13 serves as ground for suppressor 17 and filter 19 and is located between input 12-1 and output 12-2. Preferably, outer conductor 13 is forged, machined, or otherwise constructed from one or more pieces of rigid, durable and highly conductive material, such as brass or a steel alloy with a suitable protective and conductive finish.

As seen most clearly in FIGS. 1 and 2, outer conductor 13 is in the form of a generally cylindrical housing that is shaped to define a partially enclosed, longitudinally extending central cavity 21. The inner diameter of outer conductor 13, which defines central cavity 21, is preferably expanded along a portion of its length to accommodate the various parts of voltage suppressor 17 and low-pass filter 19.

In the present embodiment, outer conductor 13 is represented as comprising a first end plug 23 and a cap 25 that are press fit into opposing ends of a generally tubular cover, or sleeve, 27 in a coaxial relationship relative thereto. However, as referenced above, outer conductor 13 could be constructed using an alternative number and configuration of pieces without departing from the spirit of the present invention. To facilitate assembly with cover 27, and to create space for internal components, each of end plug 23 and cap 25 is preferably provided with a slight counterbore at its mating end.

The distal end of end plug 23 is reduced in diameter relative to cover 27 and thereby is appropriately dimensioned for through hole mounting in a bulkhead, panel or other similar mounting structure. To facilitate securement of outer conductor 13 onto the designated mounting structure, end plug 23 includes external threads 29 on which a lock washer 31 and a hex nut 33 are coaxially mounted.

Inner Conductor 15

Figure 4:
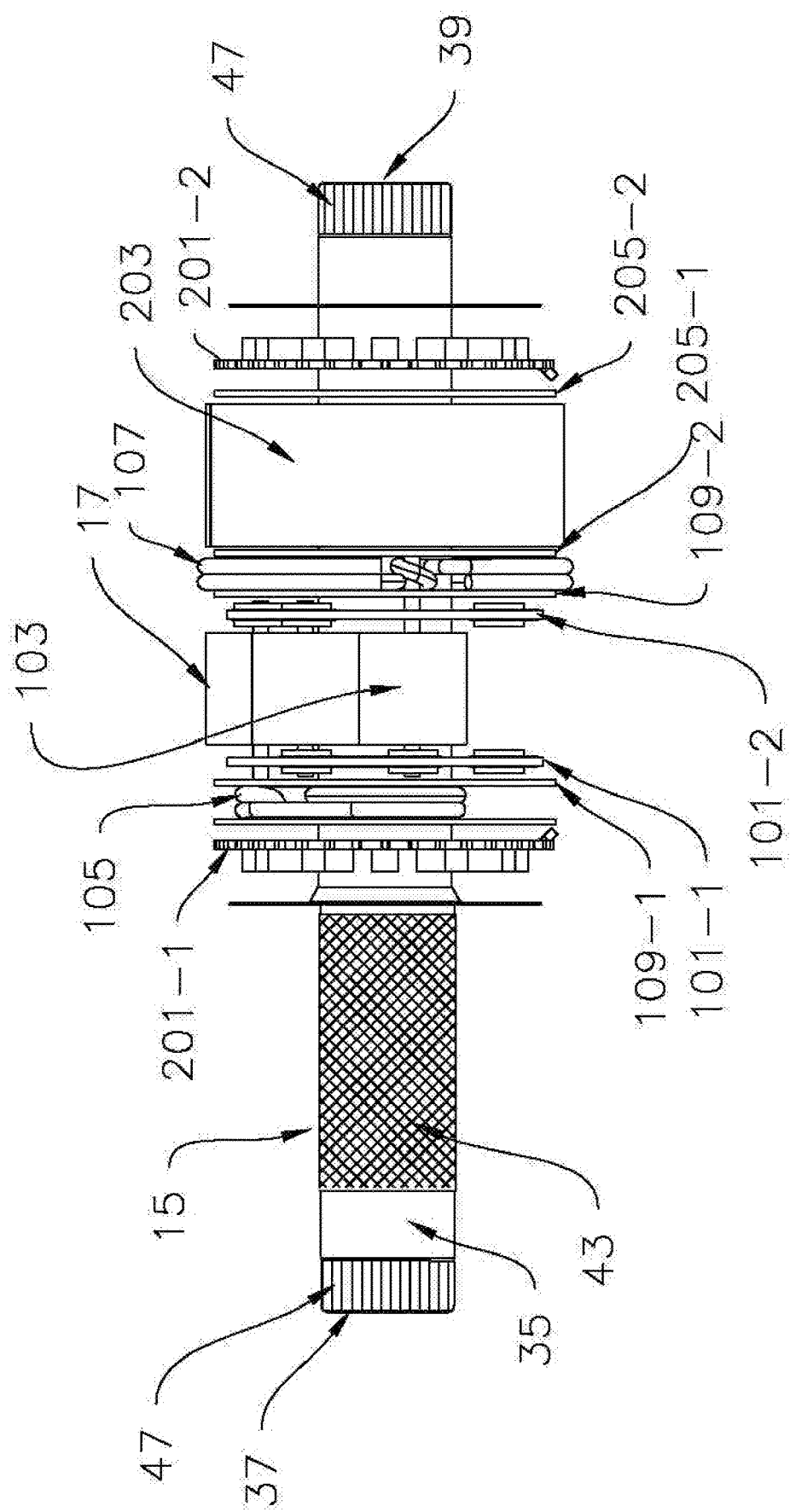
FIG. 4 is a section view of the center electrode, voltage suppression pack and low-pass filter shown in FIG. 2.

As seen most clearly in FIGS. 1, 2 and 4, inner conductor 15 extends longitudinally within central cavity 21 in both a conductively isolated and coaxial relationship relative to outer conductor 13. During normal operation of device 11, inner conductor 15 serves to transmit electrical power within the larger electrical power system.

Inner conductor 15 comprises an elongated, center electrode 35 that extends longitudinally within central cavity 21. Electrode 35 is constructed as a unitary, generally solid cylindrical pin that is constructed of a highly conductive material suitable for transmitting electrical signals, such as a copper alloy or aluminum with a suitable corrosion protective and conductive finish.

As can be seen, center electrode 35 comprises a first end 37 that projects out through end plug 23 in electrical isolation therewith and a second end 39 that projects out through cap 25 in electrical isolation therewith. A threaded, longitudinal bore 41 is formed into each of first and second ends 37 and 39, for reasons to become apparent below.

A portion of the outer surface of electrode 35 is fixedly bonded to the inner surface of end plug 23 by a supply of high-temperature rated adhesive (not shown), such as an epoxy, that is deposited in the narrow annular gap formed between electrode 35 and end plug 23. In this manner, the adhesive not only fixes the orientation of electrode 35 within end plug 23 but also serves as an insulating material therebetween. To assist in the bonding strength of the adhesive, a spiral groove, knurled region, or other similar retention feature is preferably formed in at least one of the exterior surface of electrode 35, as indicated by reference numeral 43 in FIG. 4, and the inner surface of end plug 23, as indicated by reference numeral 44 in FIG. 2.

Referring back to FIGS. 1 and 2, first and second annular bushings 45-1 and 45-2 are mounted over first and second ends 37 and 39, respectively, of electrode 35. As seen most clearly in FIG. 4, knurled regions 47 are preferably formed on the external sections of electrode 35 in direct contact with bushings 45 in order to facilitate assembly (i.e. retain bushings 45) and reduce the electrical contact resistance between bushings 45 and electrode 35.

Each bushing 45 is preferably constructed of a suitable conductive material and includes an enlarged, flat, contact surface 49 which is suitable for electrical connection to wire lugs or bus bars (not shown). As seen in FIG. 2, the diameter of contact surface 49 for each bushing 45 is greater than the diameter of electrode 35. Enlarged contact surface 49 thereby serves to facilitate electrical connection of external devices to electrical power conditioning device 11. Additionally, expanded contact surface 49 lowers contact resistance with conductive leads connected thereto, thereby reducing voltage drop and associated power dissipation through the region of connection.

First and second annular insulators 51-1 and 51-2 are axially mounted on center electrode 35, with first insulator 51-1 firmly wedged between the distal end of plug 23 and first bushing 45-1 and second insulator 51-2 firmly wedged between the distal end of cap 25 and second bushing 45-2. In use, insulators 51 not only prevent current flow between neighboring sections of inner conductor 15 and outer conductor 13 but also assist in the assembly of electrical power conditioning device 11 by, inter alia, helping to maintain electrode 35 properly centered within outer conductor 13.

As seen most clearly in FIG. 1, each insulator 51 preferably includes at least one external, circumferential groove 53 in order to satisfy creepage distance requirements (i.e. the minimum length of dielectric material needed to effectively insulate two conductive parts) and thereby raise its associated breakdown voltage (i.e. the threshold voltage which causes an insulator to exhibit dielectric failure by arcing).

As referenced briefly above, electrical connection to inner conductor 15 of device 11 is preferably achieved through exposed contact surface 49 of bushings 45. Specifically, as shown in FIGS. 1 and 2, a bolt 55 carrying a lock washer 57 is axially inserted through a fitted hole formed in each bushing 45 and, in turn, into threaded engagement with the longitudinal bore 41 in the corresponding end of center electrode 35. Accordingly, connection can be established with inner conductor 15 by sandwiching an appropriate connection element (e.g. a wiring lug or bus bar) between washer 57 and contact surface 49 of its corresponding bushing 45 and, in turn, tightening bolt until a suitable conduction path is established therebetween.

It should be noted that, with outer conductor 13 and inner conductor 15 assembled in the manner set forth above, a plurality of mechanical gaskets 59, such as O-rings, and/or sealant is preferably disposed between adjoining pieces at select locations, as seen most clearly in FIG. 2. In this manner, electrical power conditioning device 11 is effectively sealed and thereby prevents any moisture from entering and potentially damaging sensitive electrical components retained therein.

Voltage Suppressor 17

As referenced above, a voltage suppression pack 17 conductively couples inner conductor 15 to outer conductor 13. In use, voltage suppression pack, or suppressor, 17 serves to discharge potentially harmful transient voltages, such as of the type generated from a lightning strike, which are transmitted along inner conductor 15 while, at the same time, enabling electrical power within the desired voltage range to pass along inner conductor 15 unimpeded.

As will be explained in detail below, voltage suppressor 17 comprises one or more transient voltage suppression components that are connected in series between inner conductor 15 and outer conductor 13. As a feature of the present invention, the voltage suppression components are uniquely arranged in circumferential array around inner conductor 15, thereby creating a highly effective and compact solution for treating transient voltages.

Specifically, referring now to FIGS. 4, 5(a) and 5(b), voltage suppression pack 17 comprises (i) first and second annular printed circuit boards (PCBs) 101-1 and 101-2 axially mounted on center electrode 35 in a spaced apart and parallel relationship, (ii) a plurality of diodes 103-1, 103-2 and 103-3 extending orthogonally between the pair of PCBs 101 in a circumferential array around center electrode 35, (iii) inner and outer contacts 105 and 107 disposed on opposing outer surfaces of PCBs 101-1 and 101-2, respectively, and (iv) a pair of loose fitting dielectric washers 109-1 and 109-2 for electrically insulating the largely exposed outer surface of PCBs 101-1 and 101-2, respectively.

Figures 6A, 6B:
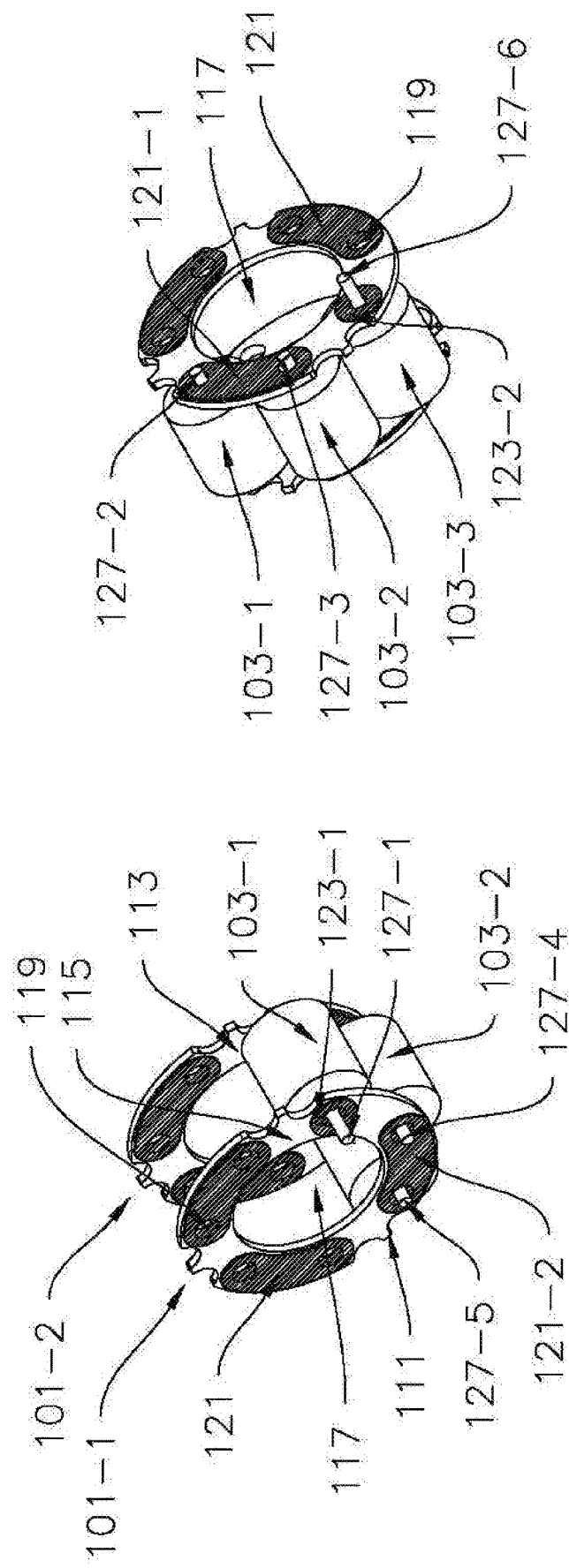
FIGS. 6(a) and 6(b) are left end perspective and right end perspective views, respectively, of the voltage suppression pack shown in FIG. 5(a), the voltage suppression pack being shown with the inner spring contact, outer spring contact and insulating washers removed therefrom to illustrate the connection details for the plurality of diodes.

As seen most clearly in FIGS. 6(a) and 6(b), each PCB 101 comprises a flat, annular, dielectric base 111 which includes a generally flat inner surface 113 and a generally flat outer surface 115. Base 111 is shaped to define an enlarged central opening 117 which is dimensioned to receive center electrode 35. Base 111 is additionally shaped to define a plurality of thru-holes, or bores, 119 which are arranged in an equidistantly-spaced, circular configuration.

Each PCB 101 additionally includes dual-eyelet conductive plates, or jumps, 121 as well as single-eyelet conductive plates 123 that are mounted on at least one surface of base 111. As will be explained further below, the location and arrangement of conductive plates 121 and 123 allows for the series connection of a plurality of diodes arranged in a circular array. As can be appreciated, the connection of diodes in series lowers the use of each individual diode, thereby providing voltage suppression pack 17 with higher overall pulse current capabilities.

As referenced briefly above, a plurality of diodes 103 extends orthogonally between PCBs 101 in a circular array around inner electrode 35 at a fixed distance relative thereto, with the longitudinal axis of each diode 103 extending generally parallel to the longitudinal axis of center electrode 35. Each diode 103 is represented herein as a Zener diode, either unidirectional or bidirectional in type, which includes opposing conductive terminals, or leads, 127. As can be seen in FIGS. 6(a) and 6(b), each terminal 127 projects through a corresponding bore 119 in each PCB 101.

As noted above, the configuration of plates 121 and 123 creates a series connection between the plurality of diodes 103 mounted on PCBs 101. Specifically, as shown in FIG. 6(a), terminal 127-1 of diode 103-1 projects through single-eyelet plate 123-1 on PCB 101-1 and serves as the input terminal for suppressor 17. The opposite terminal 127-2 for diode 103-1 is conductively coupled to terminal 127-3 of diode 103-2 via conductive jump 121-1 on PCB 101-2, as shown in FIG. 6(b). In turn, the opposite terminal 127-4 for diode 103-2 is conductively coupled to terminal 127-5 of diode103-3 via conductive jump 121-2 on PCB 101-1, as shown in FIG. 6(a). Finally, the opposite terminal 127-6 for diode 103-3 projects through single-eyelet plate 123-2 on PCB 101-2 and serves as the output terminal for suppressor 17, as shown in FIG. 6(b).

In the present embodiment, three separate diodes 103 are shown connected in series based on the conductive path defined by PCBs 101. However, it should be noted that transient voltage suppression pack 17 is not limited to a three diode construction. Rather, it is to be understood that suppressor 17 could be alternatively configured with a greater or fewer number of diodes 103 in series without departing from the spirit of the present invention. For instance, suppression pack 17 is shown herein as being capable of accommodating as many as seven diodes 103 in series within the same voltage suppression package (i.e. without requiring any increase in the size of suppressor 17 and, in turn, device 11), which is highly desirable. The particular specific type and number of diodes 103 utilized in suppressor pack 17 is preferably selected based upon, inter alia, typical voltages received in the intended application, the waveform and magnitude of common transient pulses, and size restrictions within the housing for electrical power conditioning device 11.

As noted briefly above, the cordwood design of voltage suppression pack 17 maximizes the number of rounded diodes 103 that can be connected in series while, at the same time, accommodating both widened conductive plates 121 and 123 (to facilitate soldering) and minimized interconnection lengths. As a result, suppressor 17 is able to effectively discharge transient pulses using a relatively compact physical structure, which is highly desirable. Furthermore, it should be noted that the arrangement of diodes 103 as a circular array within the annular space between inner conductor 15 and outer conductor 13 results in the positioning of each diode lead 127 at the approximate midpoint between these two conductive bodies, thereby providing basic insulation to each diode lead 127 using an existing air gap in the device package.

Referring back to FIGS. 4, 5(a) and 5(b), inner and outer contacts 105 and 107 are disposed on opposing sides of PCBs 101-1 and 101-2, respectively. In use, inner and outer contacts 105 and 107 serve to electrically connect voltage suppression pack 17 to inner and outer conductors 15 and 13, respectively.

Figure 7:
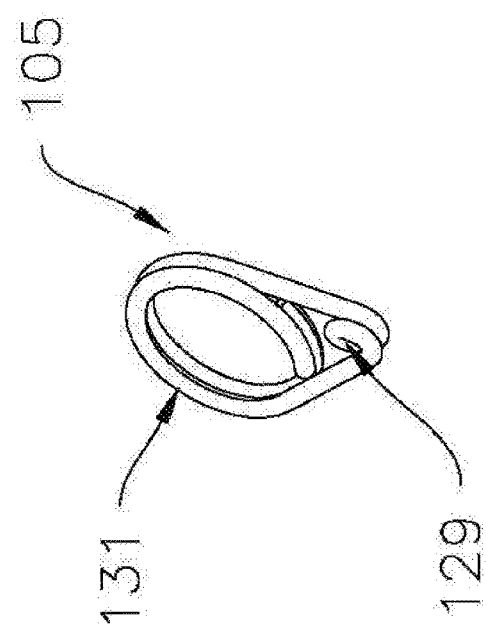
FIG. 7 is a left end perspective view of the inner spring contact shown in FIG. 5(a)

As seen most clearly in FIGS. 4, 5(a) and 7, inner contact 105 is constructed as a wire spring contact which includes a smaller terminal loop 129 and larger conductor loop 131. As shown in FIG. 5(a), terminal loop 129 is dimensioned to receive input terminal 127-1 of diode 103-1. Through a fitted relationship and/or the use of solder, input terminal 127-1 is conductively coupled to terminal loop 129 of inner contact 105.

Conductor loop 131 of inner contact 105 is dimensioned to fittingly receive center electrode 35, as seen in FIG. 4. As can be appreciated, conductor loop 131 has a resilient construction and is designed to expand to the extent necessary to axially receive center electrode 35 and maintain circumferential electrical contact therewith. At the same time, it is to be understood that both terminal loop 129 and the outer diameter of conductor loop 131 are sized and shaped so as to maintain a suitable amount of clearance from outer conductor 13.

Figure 8:
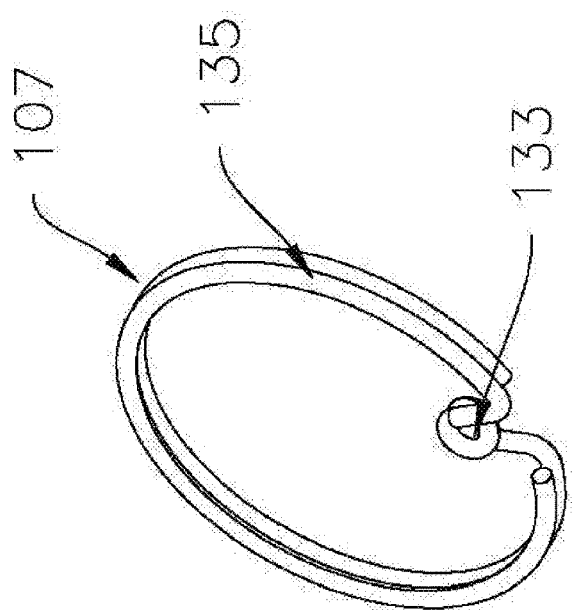
FIG. 8 is a right end perspective view of the outer spring contact shown in FIG. 5(b)

As seen most clearly in FIGS. 4, 5(b) and 8, outer contact 107 is constructed as wire spring contact which includes a smaller terminal loop 133 and a larger conductive loop 135. As shown in FIG. 5(b), terminal loop 133 is dimensioned to receive output terminal 127-6 of diode 103-3. Through a fitted relationship and/or the use of solder, output terminal 127-6 is conductively coupled to terminal loop 133 of outer contact 107.

Conductor loop 135 is dimensioned to fit snugly within outer conductor 13. As can be appreciated, conductor loop 135 is slightly greater in diameter than the inner diameter of outer conductor 13. However, conductor loop 135 has a resilient construction and is designed to contract, or compress, to the extent necessary to fit within outer conductor 13 and maintain circumferential electrical contact therewith. At the same time, it is to be understood that the both terminal loop 133 and the inner diameter of conductor loop 135 are sized and shaped so as to maintain a suitable amount of clearance from inner conductor 15.

Accordingly, inner contact 105 serves to electrically connect input terminal 127-1 of voltage suppression pack 17 to inner conductor 15 and outer contact 107 serves to electrically connect output terminal 127-6 of voltage suppression pack 17 to outer conductor 13. The resilient construction of loops 131 and 135 not only serves to account for tolerance variation of parts but also accommodate for certain external factors which may compromise connection, such as temperature change as well as shock and vibrational forces. As such, contacts 105 and 107 reliably maintain suppressor 17 connected between outer and inner conductors 13 and 15.

As referenced briefly above, loose fitting dielectric washers 109-1 and 109-2 are provided for electrically insulating the largely exposed, plated surface of each PCB 101. Specifically, as shown in FIGS. 5(a) and 5(b), washer 109-1 is preferably disposed between PCB 101-1 and inner contact 105 to prevent inadvertent electrical contact therebetween, with washer 109-1 being held loosely in place by inserting input terminal 127-1 through a suitable hole formed in washer 109-1. Similarly, washer 109-2 is preferably disposed between PCB 101-2 and outer contact 107 to prevent inadvertent electrical contact therebetween, with washer 109-2 being held loosely in place by inserting output terminal 127-6 through a suitable hole formed in washer 109-2.

Low-Pass Filter 19

As referenced briefly above, low-pass filter 19 removes unwanted high frequency energy (e.g. noise or other similar types of electromagnetic interference) transmitted along inner conductor 15 of electrical power conditioning device 11.

Referring back to FIGS. 3 and 4, filter 19 comprises a first filtering capacitor array 201-1, a second filtering capacitor array 201-2 and a magnetic core 203 that are mounted between outer conductor 13 and inner conductor 15 so as to form a Pi-network. The unique mechanical packaging of filter 19 between outer and inner and conductors 13 and 15, as well as its functionality in filtering high frequency energy, serve as notable features of the present invention.

First filtering capacitor array 201-1 and second filtering capacitor array 201-2 are axially mounted on center electrode 35 in a spaced apart relationship, with array 201-1 located at the source end of device 11 and array 201-2 located at the load end of device 11.

Magnetic core 203 is axially mounted on center electrode 35 between capacitor arrays 201. Preferably, magnetic core 203 is in the form of a ring constructed using a continuous or gapped ferrite material that is suitable to provide the filter response required by filter 19. As can be seen, magnetic core 203 is preferably positioned such that Zener diodes 103 of voltage suppressor 17 are located in direct parallel with first capacitor array 201-1 on the side of device 11 that is more exposed to transient voltages (i.e. the input, or source, side).

A pair of dielectric washers 205-1 and 205-1 is axially mounted on center electrode 35 on opposite faces of magnetic core 203 to prevent electrical conductivity with adjacent conductive elements of suppressor 17 and filter 19. As seen in FIG. 2, the outer and inner diameters of magnetic core 203 are preferably dimensioned so as to maintain a limited degree of clearance relative to outer and inner conductors 13 and 15, respectively. Accordingly, the insertion of electrical inner conductor 15 through core 203 creates inductance L within device 11 along the energy transmission path, as will be explained further below.

Figure 9:
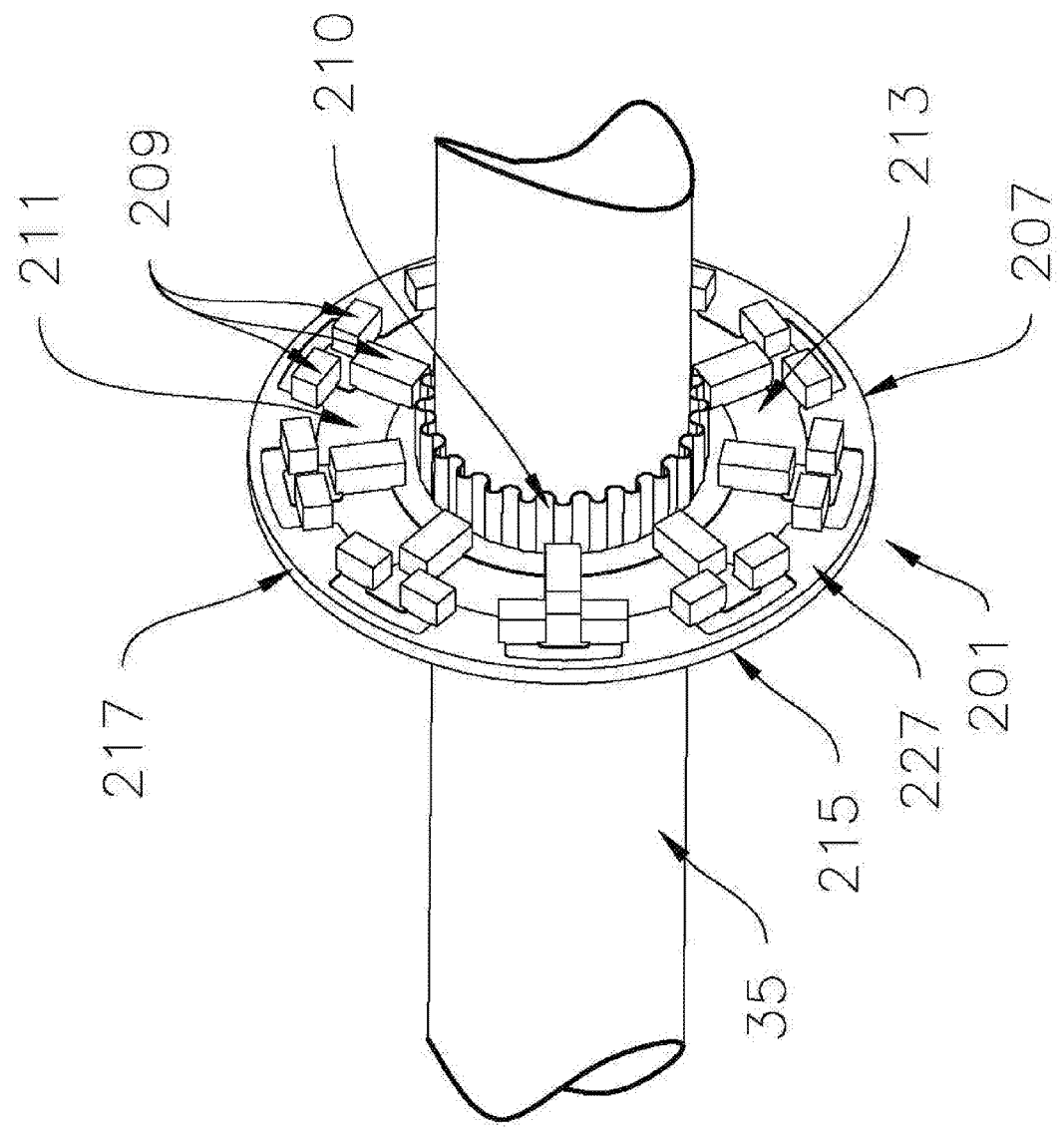
FIG. 9 is a fragmentary, front perspective view of the second capacitor array and center electrode shown in FIG. 4.

Referring now to FIGS. 9, 10(*a*) and 10(*b*), each capacitor array 201 includes a printed circuit board (PCB) 207, a plurality of surface mount, ceramic capacitors 209 mounted on PCB 207, and a corrugated contact 210 for fixedly mounting PCB 207 in place on center electrode 35.

As can be seen, PCB 207 comprises a rigid, annular dielectric base 211 which includes a generally flat top surface 213, a generally flat bottom surface 215 and an outer edge 217. Additionally, base 211 includes an inner edge 219 shaped to define a circular central opening 221 that is dimensioned to fittingly receive center electrode 35 with corrugated spring contact 210 compressed radially between, as will be explained further below.

For reasons to become apparent below, disk-shaped base 211 is sized to span the distance from inner conductor 15 to outer conductor 13. Along the outer periphery of base 211, plated top surface 213 is designed to abut against a complementary annular step formed in the inner surface of outer conductor 13. As will be explained in detail below, a spring washer is mounted within outer conductor 13 and continuously urges bottom surface 215 such that the outer periphery of top surface 213 is maintained in contact against the complementary annular step formed in outer conductor 13. The resilient nature of the spring washer ensures that PCB 207 remains fixed in place within and in continuous contact against outer conductor 13, even upon the application of external vibratory forces on device 11.

Top surface 213 of base 211 is plated with a conductive pattern 223 which, along with capacitors 209, defines the conductive path for PCB 207. Specifically, as shown in FIGS. 10(*a*) and 10(*b*), conductive pattern 223 includes an inner conductive ring 225 that is provided on the region of top surface 213 that immediately defines central opening 221, with central opening 221 being through-hole plated as well. Additionally, an outer conductive ring 227 is provided on the region of top surface 213 that defines the outer periphery of base 211, outer ring 227 including a set of equidistantly spaced, generally trapezoidal pads 229 that project radially inward towards inner ring 225. Lastly, a set of small, square-shaped conductive pads 231 is provided on top surface 213 of base 211, with one pad 231 disposed between each adjacent pair of trapezoidal pads 229 in a spaced apart relationship relative to the adjacent trapezoidal pads 229, as well as inner ring 225 and the remainder of outer ring 227.

A plurality of capacitors 209 is mounted on PCB 207 in a unique arrangement that affords a relatively compact construction without compromising low-pass filtering capabilities, as will explained in detail below. Preferably, each capacitor 209 is a ceramic capacitor which performs effectively in filtering undesirable, high frequency electromagnetic energy. In the art, ceramic capacitors are widely considered to be highly fragile, and therefore largely unreliable, devices. However, the unique arrangement of capacitors 209 within each array 201 creates a level of redundancy in case one or more capacitors 209 fail over time, thereby providing previously uncontemplated reliability without creating inductance along the power transmission path.

As seen most clearly in FIG. 10(*b*), capacitor array 201 is designed to include a plurality of individual capacitor sectors 233 that are radially arranged in an equidistant fashion. Each sector 233 is contained within a wedge-like region that originates from the center of central opening 221 and extends radially through the approximate midpoint of an adjacent pair of conductive pads 229.

In the present embodiment, each capacitor array 201 is designed to include nine capacitor sectors 233, with each sector 233 extending approximately 40 degrees. However, it should be noted that each array 201 is not limited to a particular number of sectors 233. Rather, it is to be understood that each array 201 could be provided with a greater or fewer number of sectors 233 without departing from the spirit of the present invention. Also, although not shown herein, a second set of nine capacitor sectors 233 could be similarly provided on bottom surface 215 of PCB 207 to increase the overall capacitance of capacitor array 201.

In the present embodiment, each sector 233 includes a first capacitor 209-1 that is mounted on PCB 207 in a generally radial orientation with one terminal 235-1 conductively coupled to inner ring 225 (e.g. through surface mounting) and another terminal 235-2 conductively coupled to pad 231-1. A second capacitor 209-2 is mounted on PCB 207 in a generally orthogonal relationship relative to capacitor 209-1, with one terminal 235-3 conductively coupled to pad 231-1 and another terminal 235-4 conductively coupled to a first trapezoidal pad 229-1 on outer ring 227. A third capacitor 209-3 is also mounted on PCB 207 in a generally orthogonal relationship relative to capacitor 209-1, but with one terminal 235-5 conductively coupled to pad 231-1 and another terminal 235-6 conductively coupled to a second trapezoidal pad 229-2 which is adjacent to first pad 229-1. The preferred relationship between the axis of capacitor 209-1 and each of capacitors 209-2 and 209-3 is a right angle. However, the angle defined between the axis of capacitor 209-1 and each of capacitors 209-2 and 209-3 could range from 45 degrees to 90 degrees in alternate embodiments. Therefore, the included angle between capacitors 209-2 and 209-3 could range from 90 degrees (not shown) to 180 degrees, as shown in FIG. 10(*b*).

As seen in FIG. 3, capacitors 209-1, 209-2 and 209-3 within each sector 233 thereby effectively create a relatively compact, T-shaped configuration between inner conductor 15 and grounded outer conductor 13 that is suitably designed to filter high frequency energy from the transmission line. Notably, electromagnetic energy is filtered across all three capacitors 209, preferably by selecting capacitor values that most evenly distribute the high frequency energy (i.e. using two smaller parallel capacitors 209-2 and 209-3 which together approximate the capacitance and voltage value of the somewhat larger series capacitor 209-1). Additionally, the above-described configuration of capacitors 209 within each sector 233 (i) reduces the equivalent series inductance (ESL) of ceramic capacitors 209 to a minimum, thereby allowing use of array 201 in relatively high frequency filtering applications, and (ii) creates functional redundancy, which will be explained further below.

It should also be noted that each sector 233 is not limited to the use of three capacitors 209 arranged in the T-shaped configuration set forth in detail above. Rather, it is to be understood that a fewer or greater number of capacitors 209 could be alternatively configured within each sector 233 without departing from the spirit of the present invention. For example, each sector 233 could be alternatively designed to include a single pair of capacitors 209 connected in series between inner ring 225 and outer ring 227. As yet another example, each sector 233 could be alternatively designed to include a single capacitor 209 so as to create an array of capacitors of the type described in U.S. Pat. No. 8,675,339 to G. M. Kauffman, the disclosure of which is incorporated herein by reference.

Figure 11C:
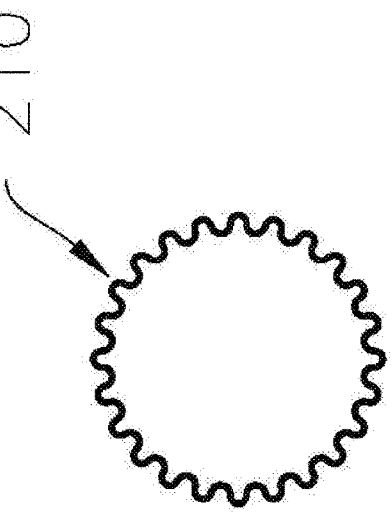
FIGS. 11(a)-(c) are front perspective, front plan, and right side plan views, respectively, of the corrugated spring contact shown in FIG. 9.
Figure 11A:
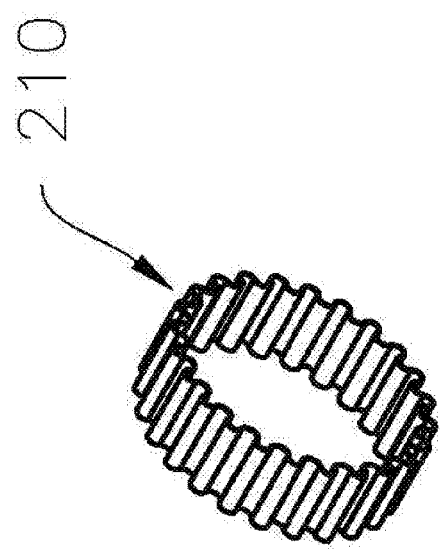
Figure 11B:
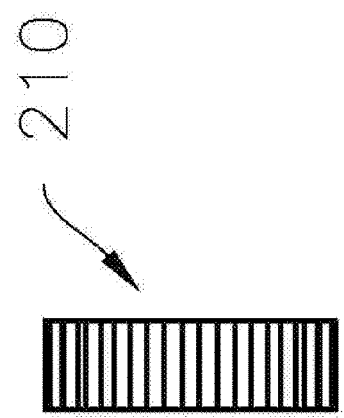

As referenced above, corrugated contact 210 is fittingly inserted between through-hole plated central opening 221 of PCB 207 and center electrode 35, as shown in FIG. 9. Corrugated contact 210, shown in isolation in FIGS. 11(*a*)-(*c*), is represented as a resilient metal sleeve, or ribbon, which is preferably constructed out of beryllium copper finished with a suitable conductive material, such as tin. Due to its thin, resilient construction, contact 210 is able to deform or compress in size (as much as 30%) upon receiving an inwardly applied force. As a result, metal contact 210 is designed to continuously maintain a conductive path between center electrode 35 and inner ring 225 of array 201. As can be appreciated, the resilient nature of contact 210 serves to compensate for tolerance variation of parts as well as certain environmental conditions, including temperature changes, shock and/or vibration, which may otherwise disrupt the required conductive path.

Figure 12B:
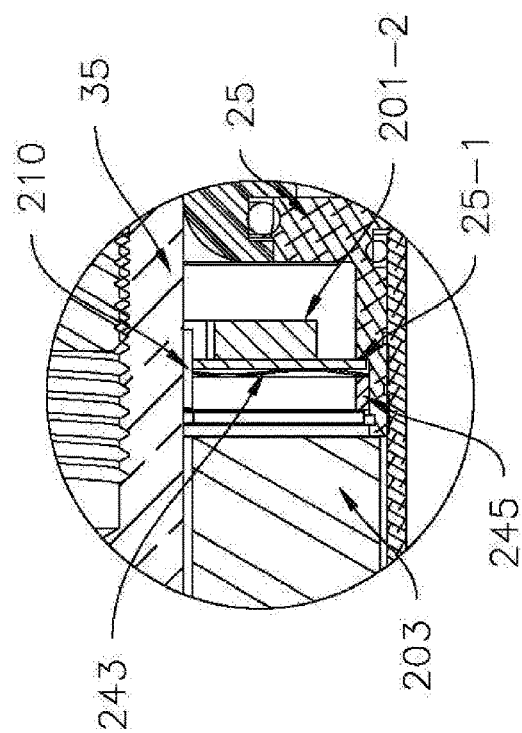
FIG. 12(b) is an enlarged, fragmentary, section view of the electrical power conditioning device shown in FIG. 2, the figure illustrating the use of a wavy spring washer to conductively couple the outer ring of the second capacitor array to a contact surface in the outer conductor.
Figure 12A:
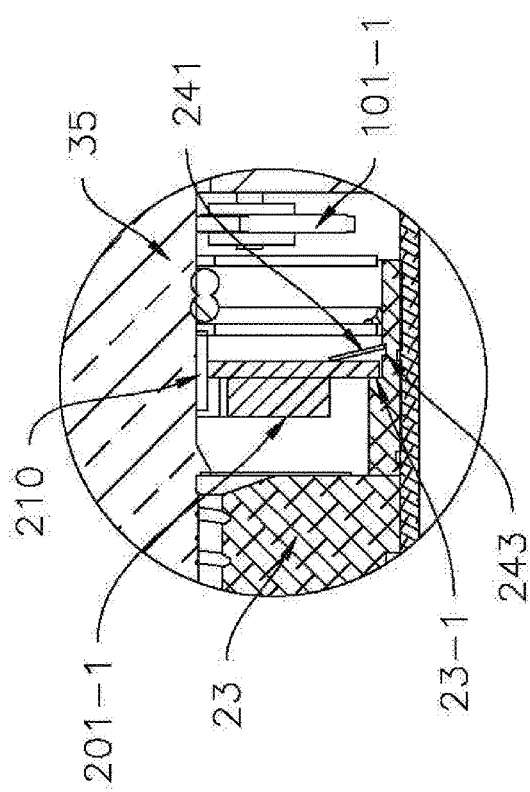
FIG. 12(a) is an enlarged, fragmentary, section view of the electrical power conditioning device shown in FIG. 2, the figure illustrating the use of a conical spring washer to conductively couple the outer ring of the first capacitor array to a contact surface in the outer conductor.

As noted previously, spring washers are preferably used to urge the pair of capacitor arrays 201 into conductive contact with outer conductor 13. Specifically, as shown in FIG. 12(*a*), a conical spring, or Belleville, washer 241 is preferably disposed against rear surface 215 of base 211 for first capacitor array 201-1. Conical spring washer 241 is compressed against rear surface 215 and, in turn, snap-fit into a preformed groove 243 in the inner surface of outer conductor 13, thereby retaining capacitor array 201-1 fixed in place within interior cavity 21. As a result, outer conductive ring 227 of first capacitor array 201-1 is retained in direct contact against a complementary annular shelf 23-1 formed in end plug 23, thereby ensuring a conductive path is continuously maintained between outer ring 227 of PCB 207 and grounded outer conductor 13.

Similarly, as shown in FIG. 12(*b*), a wavy spring washer 243 is preferably disposed against rear surface 215 of base 211 for second capacitor array 201-2 with suitable force so as to cause washer 243 to compress. While maintaining this compressive force, a retaining ring 245 is disposed against the free surface of wavy spring washer 243 and, in turn, secured into engagement with the inner surface of outer conductor 13, thereby retaining capacitor array 201-2 fixed in place within interior cavity 21. As a result, outer conductive ring 227 of second capacitor array 201-2 is retained in direct contact against a complementary annular shelf 25-1 formed in cover 25, thereby ensuring a conductive path is continuously maintained between outer ring 227 of PCB 207 and grounded outer conductor 13.

Accordingly, with device 11 properly assembled, each capacitor array 201 conductively connects inner conductor 15 with outer conductor 13, as shown in FIG. 3. As can be seen, the multiple capacitor sectors 233 extend in parallel between inner conductor 15 and outer conductor 13. Further, magnetic core 203 creates inductance along the transmission line between the pair of capacitor arrays 201.

As a result, capacitor arrays 201 and the inductance created from magnetic core 203 together form a low-pass filter 19 that is optimally designed to remove undesirable, high frequency noise, for example, of the type attributable to common electromagnetic interference. Additionally, filter 19 can be optimized for a specific application by selecting, among other things, (i) a particular size of inner electrode 15, (ii) a particular size of outer electrode 13, and (ii) a certain size, capacitance, number and arrangement of individual ceramic capacitors 209 contained within each capacitor array 201.

As a feature of the present invention, the inclusion of several independently operating sectors 233, as well as the T-shaped configuration of capacitors 209 within each sector 233, provides filter 19 with low-pass filtering redundancy, which is critical due to the relative sensitivity of ceramic capacitors. For instance, in FIG. 3, if capacitor 209-1 experiences a short circuit failure, capacitors 209-2 and 209-3 would prevent DC or low frequency AC current from being faulted to ground. In addition, the filtering action is continued by other sectors 233 operating in parallel with capacitors 209-2 and 209-2.

Similarly, if either capacitor 209-2 or 209-3 experiences a short circuit failure, filtering capability can be maintained through the other functioning sectors 233 and the still functioning capacitors 209 within the failure affected sector 233. Therefore, even if each capacitor array 201 has several single point failures (e.g. multiple cracked capacitors), excessive DC or AC fault current can still be effectively blocked from inner conductor 15 to ground (i.e. without overheating or creating secondary failure modes in array 201).

The embodiment shown above is intended to be merely exemplary and those skilled in the art shall be able to make numerous variations and modifications to it without departing from the spirit of the present invention. All such variations and modifications are intended to be within the scope of the present invention as defined in the appended claims.

For instance, although the unique, compact construction of each of voltage suppressor 17 and low-pass filter 19 renders it particular well suited for integration within a coaxial-type electrical power conditioning device, it is to be understood that each of suppressor 17 and filter 19 could be utilized individually within other types and styles of devices and systems without departing from the spirit of the present invention.

What is claimed is:

1. An electrical power conditioning device for transmitting electromagnetic energy between a source and a load, the device comprising:
   (a) an outer conductor;
   (b) an inner conductor for transmitting the electromagnetic energy between the source and the load, the inner conductor extending within the outer conductor, the inner and outer conductors being spaced apart and electrically insulated from one another;
   (c) a low-pass filter disposed between the outer conductor and the inner conductor, the low-pass filter attenuating electromagnetic energy transmitted along the inner conductor which has a frequency higher than a designated cutoff level; and
   (d) a voltage suppression pack disposed between the outer conductor and the inner conductor, the voltage suppression pack treating transient voltages transmitted along the inner conductor, the voltage suppression pack comprising a plurality of voltage suppression components and a pair of printed circuit boards to which each of the plurality of voltage suppression components is connected, each of the pair of printed circuit boards being axially mounted on the inner conductor.

2. The device as claimed in claim 1 wherein the printed circuit boards electrically connect the plurality of voltage suppression components in series.

3. The device as claimed in claim 1 wherein the plurality of voltage suppression components is arranged in parallel between the pair of printed circuit boards.

4. The device as claimed in claim 3 wherein the plurality of voltage suppression components extends between the pair of printed circuit boards in a circular array around the inner conductor.

5. The device as claimed in claim 4 wherein the voltage suppression pack further comprises first and second contacts in electrical connection with the plurality of voltage suppression components, the first contact being conductively coupled to the inner conductor and the second contact being conductively coupled to the outer conductor.

6. An electrical power conditioning device for transmitting electromagnetic energy between a source and a load, the device comprising:
   (a) an outer conductor;
   (b) an inner conductor for transmitting the electromagnetic energy between the source and the load, the inner conductor extending within the outer conductor, the inner and outer conductors being spaced apart and electrically insulated from one another;
   (c) a low-pass filter disposed between the outer conductor and the inner conductor, the low-pass filter attenuating electromagnetic energy transmitted along the inner conductor which has a frequency higher than a designated cutoff level, the low-pass filter comprising,
      (i) a first capacitor array disposed between the outer conductor and the inner conductor,
      (ii) a second capacitor array disposed between the outer conductor and the inner conductor, the second capacitor array being connected in parallel with the first capacitor array, and
      (iii) a magnetic core axially mounted on the inner conductor between the first and second capacitor arrays; and
   (d) a voltage suppression pack disposed between the outer conductor and the inner conductor, the voltage suppression pack treating transient voltages transmitted along the inner conductor.

7. An electrical power conditioning device for transmitting electromagnetic energy between a source and a load, the device comprising:
   (a) an outer conductor;
   (b) an inner conductor for transmitting the electromagnetic energy between the source and the load, the inner conductor extending within the outer conductor, the inner and outer conductors being spaced apart and electrically insulated from one another;
   (c) a low-pass filter disposed between the outer conductor and the inner conductor, the low-pass filter attenuating electromagnetic energy transmitted along the inner conductor which has a frequency higher than a designated cutoff level, the low-pass filter comprising a first capacitor array disposed between the outer conductor and the inner conductor, the first capacitor array comprising,
      (i) a printed circuit board conductively coupled to both the inner conductor and the outer conductor, and
      (ii) a plurality of capacitor sectors radially arranged on the printed circuit board; and
   (d) a voltage suppression pack disposed between the outer conductor and the inner conductor, the voltage suppression pack treating transient voltages transmitted along the inner conductor.

8. An electrical power conditioning device for transmitting electromagnetic energy between a source and a load, the device comprising:
   (d) an outer conductor;
   (e) an inner conductor for transmitting the electromagnetic energy between the source and the load, the inner conductor extending within the outer conductor, the inner and outer conductors being spaced apart and electrically insulated from one another;
   (f) a low-pass filter disposed between the outer conductor and the inner conductor, the low-pass filter attenuating electromagnetic energy transmitted along the inner conductor which has a frequency higher than a designated cutoff level, the low-pass filter comprising a first capacitor array disposed between the outer conductor and the inner conductor, the first capacitor array comprising,
      (i) a first capacitor having a first terminal and a second terminal, the first terminal of the first capacitor being conductively coupled to the inner conductor, and
      (ii) a second capacitor having a first terminal and a second terminal, the first terminal of the second capacitor being conductively coupled to the second terminal of the first capacitor, the second terminal of the second capacitor being conductively coupled to the outer conductor, the second capacitor extending at an angle relative to the first capacitor within a range from approximately 45 degrees to approximately 90 degrees; and (d) a voltage suppression pack disposed between the outer conductor and the inner conductor, the voltage suppression pack treating transient voltages transmitted along the inner conductor.

9. An electrical power conditioning device for transmitting electromagnetic energy between a source and a load, the device comprising:
(a) an outer conductor;
(b) an inner conductor for transmitting the electromagnetic energy between the source and the load, the inner conductor extending within the outer conductor, the inner and outer conductors being spaced apart and electrically insulated from one another;
(c) a low-pass filter disposed between the outer conductor and the inner conductor, the low-pass filter attenuating electromagnetic energy transmitted along the inner conductor which has a frequency higher than a designated cutoff level, the low-pass filter comprising a first capacitor array disposed between the outer conductor and the inner conductor, the first capacitor array comprising,
(i) a first capacitor having a first terminal and a second terminal, the first terminal of the first capacitor being conductively coupled to the inner conductor, and
(ii) a second capacitor having a first terminal and a second terminal, the first terminal of the second capacitor being conductively coupled to the second terminal of the first capacitor, the second terminal of the second capacitor being conductively coupled to the outer conductor, and
(iii) a third capacitor, the third capacitor having a first terminal and a second terminal, the first terminal of the third capacitor being conductively coupled to the second terminal of the first capacitor, the second terminal of the third capacitor being conductively coupled to the outer conductor;
(iv) wherein each of the second and third capacitors extends in an orthogonal relationship relative to the first capacitor; and
(d) a voltage suppression pack disposed between the outer conductor and the inner conductor, the voltage suppression pack treating transient voltages transmitted along the inner conductor.

10. A filtering circuit, comprising:
(a) a printed circuit board having a first surface; and
(b) a plurality of capacitor sectors radially arranged on the first surface of the printed circuit board, each capacitor sector comprising at least two capacitors connected in series, each of the plurality of capacitor sectors comprising,
(i) a first capacitor extending radially on the annular printed circuit board, the first capacitor having a first terminal and a second terminal, and
(ii) a second capacitor extending at an approximate 90 degree angle relative to the first capacitor, the second capacitor having a first terminal and a second terminal, the first terminal of the second capacitor being conductively coupled to the second terminal of the first capacitor; and
(iii) a third capacitor extending at an approximate 90 degree angle relative to the first capacitor and in a parallel relationship relative to the second capacitor, the third capacitor having a first terminal and a second terminal, the first terminal of the third capacitor being conductively coupled to the second terminal of the first capacitor, the second terminal of the third capacitor being conductively coupled to the second terminal of the second capacitor.

11. A filtering device adapted for connection to ground, the filtering device comprising:
(a) a filtering capacitor; and
(b) a spring member for resiliently urging the filtering capacitor into conductive contact with ground, wherein the spring member is at least one from the group consisting of a conical spring washer and a wavy spring washer.

* * * * *